United States Patent [19]

Manteghi

[11] Patent Number: 5,661,337
[45] Date of Patent: Aug. 26, 1997

[54] TECHNIQUE FOR IMPROVING BONDING STRENGTH OF LEADFRAME TO SUBSTRATE IN SEMICONDUCTOR IC CHIP PACKAGES

[75] Inventor: Kamran Manteghi, Manteca, Calif.

[73] Assignee: VLSI Technology, Inc., San Jose, Calif.

[21] Appl. No.: 553,214

[22] Filed: Nov. 7, 1995

[51] Int. Cl.⁶ .................... H01L 23/495; H01L 23/48
[52] U.S. Cl. .................. 257/676; 257/692; 257/774; 361/774; 361/813; 361/820
[58] Field of Search .................. 257/676, 774, 257/796, 692; 361/774, 813, 820

[56] References Cited

U.S. PATENT DOCUMENTS 5,247,423  9/1993  Lin et al. .................. 361/719
5,293,066  3/1994  Tsumura .................. 257/672
5,394,298  2/1995  Sagisaka .................. 257/796
5,434,745  7/1995  Shokrgozar et al. .................. 361/735

*Primary Examiner*—Tom Thomas
*Assistant Examiner*—David Ostrowski
*Attorney, Agent, or Firm*—Majestic, Parsons, Siebert & Hsue

[57] ABSTRACT

A semiconductor substrate layer is provided which includes a plurality of severed through holes (or metallized half vias) along an edge portion of the substrate layer. The bonding fingers of a leadframe are then formed into a down set (or up set) format and soldered to the substrate at the severed, plated through holes. This technique increases the contact area between the leadframe and the substrate. In addition, the down set (or up set) format of the leadframe bonding fingers decreases the stress built up due to CTE mismatch between the substrate and the leadframe.

11 Claims, 3 Drawing Sheets

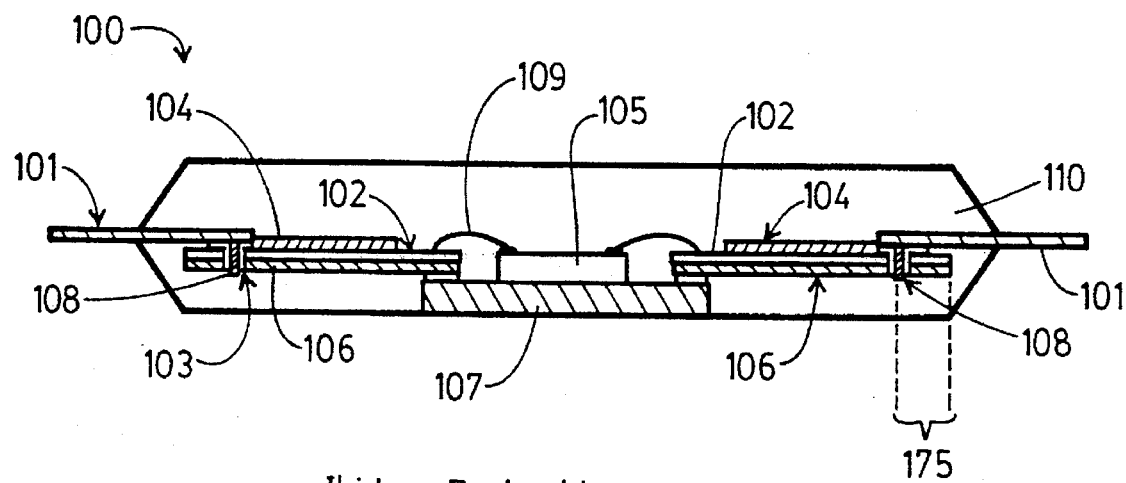
Ibiden Packsolder
FIG._1A.
(PRIOR ART)
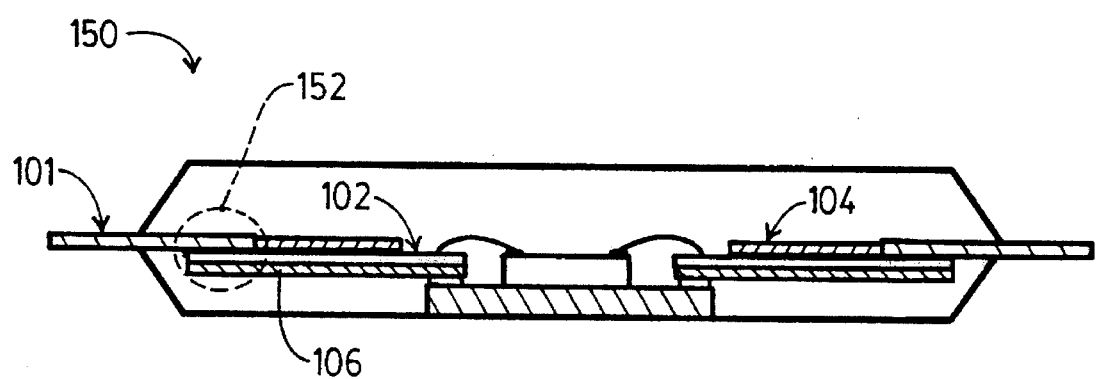
MEW ETE PACKAGE
FIG._1B.
(PRIOR ART)

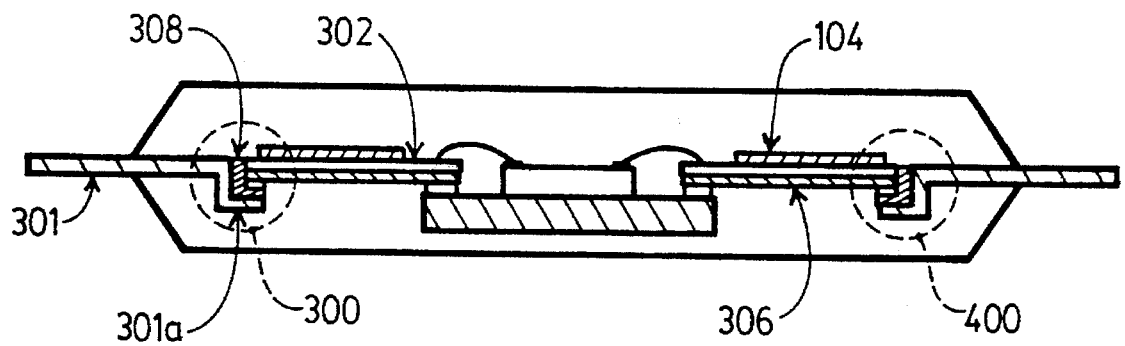
FIG._2A.
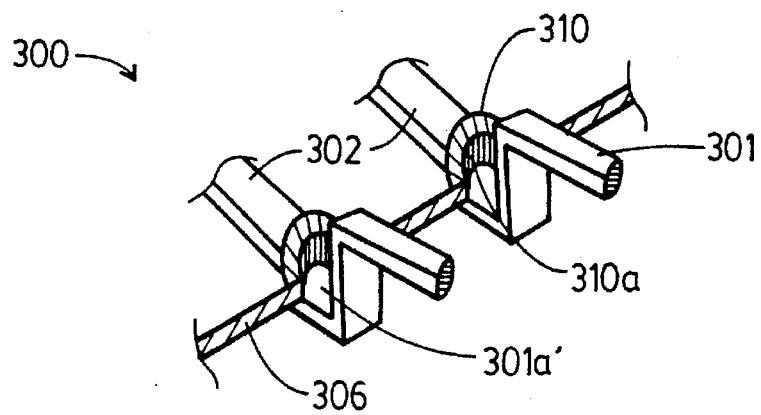
FIG._2B.
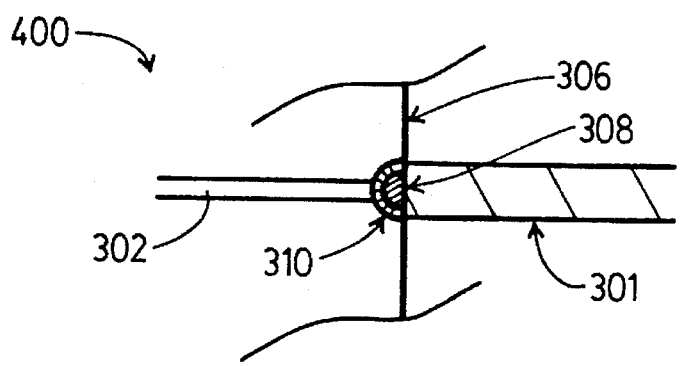
FIG._2C.

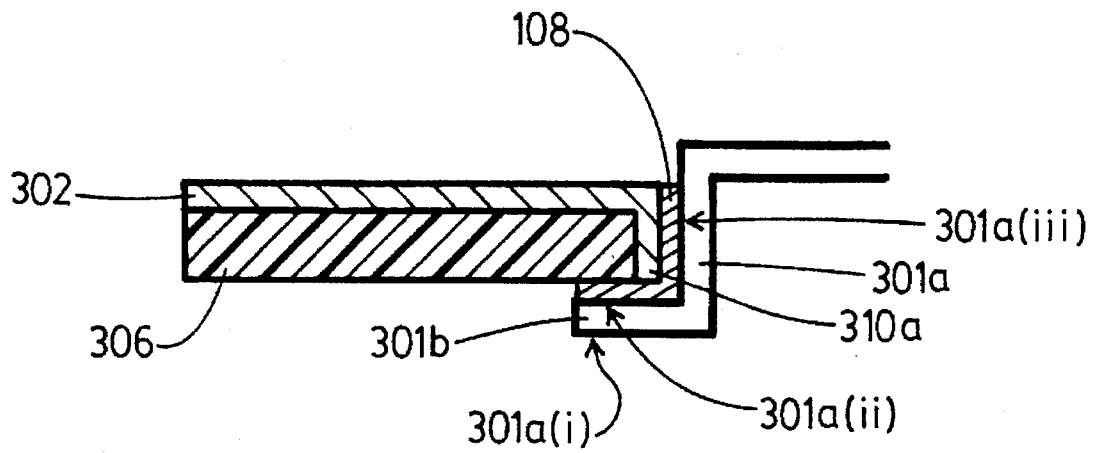
FIG._3A.
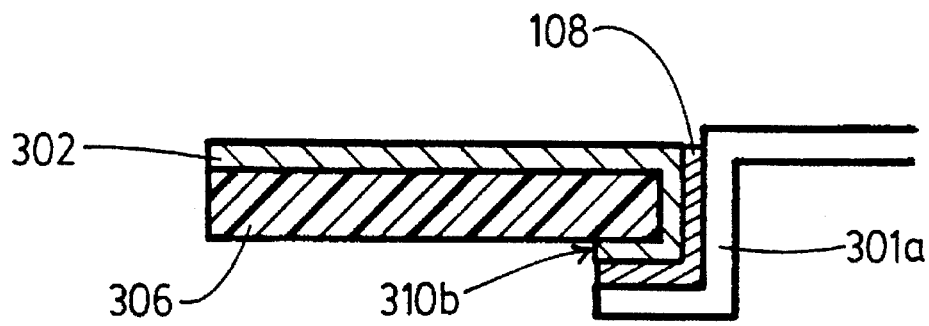
FIG._3B.

TECHNIQUE FOR IMPROVING BONDING STRENGTH OF LEADFRAME TO SUBSTRATE IN SEMICONDUCTOR IC CHIP PACKAGES

BACKGROUND OF THE INVENTION

The present invention relates to semiconductor integrated circuit chip packages, and more particularly, to a technique for improving the bonding strength of the leadframe to substrate in semiconductor packages.

In recent years, semiconductor elements have been further advanced in their high density construction and it is increasingly more difficult to mount a semiconductor element directly on a printed wiring board or the like to construct various electronic equipment. In recent practice, thus, a semiconductor element is previously mounted for example on a board for mounting the electronic part to form a semiconductor device and such semiconductor device is then electrically connected to a printed wiring board using a surface mount technology or the like. Accordingly, proposals have been made of various boards for mounting electronic parts and of semiconductor devices using the same.

For example, for a semiconductor device internally having an electronic part mounting board integrating a leadframe and a printed wiring board, a circuit board with an electronic part attached thereto must be supported on the leadframe during the fabrication process of the semiconductor device, to connect the electronic part to leads of the leadframe by means of wire bonding. According to a conventional technology, supporting of a circuit board on a leadframe is performed by joining the lead terminals of the leadframe to the conductive layer on the circuit board by means of Pb/Sn solder, Au/Sn soldering, or other solder material commonly known to one skilled in the art.

FIGS. 1A and 1B illustrate two different types of conventional ETE (electrically and thermally enhanced) semiconductor packages. In FIG. 1A, each of the leadframe's bonding fingers 101 is electrically connected to a respective metallic trace 102 on the semiconductor substrate 106 using a plated through hole 103 and solder 108. The plated through hole (or via) is plated with an electrically conductive material which makes contact with a respective copper trace 102. A leadframe bonding finger 101 is then soldered to the plated through hole 103, thereby forming an electrical connection to the conductive trace 102.

In FIG. 1B, electrical connection is made from the leadframe finger 101 to the conductive trace 102 by physically bonding the leadframe finger to the conductive trace (at area 152) using a thermal compression bonding technique.

To use solder or soldering in coupling the circuit board and the leadframe, however, the junction must be heated at least to 200 degree(s) C. An ordinarily used board made of a resin may thus be deteriorated due to heat, or an internal stress may occur therein due to the fact that the thermal balance (i.e. CTE mismatch) between the circuit board and the leadframe cannot be maintained, resulting in such problems as that faults occur at the time of encapsulation and/or mounting the electronic part, thereby reducing the reliability of the finished product.

In the above conventional technique, there are the following additional problems:

(1) Both of electrical connecting function and physical holding function are generally included in the joint portion between the leadframe and the substrate. In the aforementioned conventional technique, it is expected to secure both of electrical connecting function and physical holding function in a joint portion of a main part only by soldering. Now, when such a joint portion is reviewed with respect to the leadframe for mounting high-performance semiconductor element, it is usually related to QFP (Quad Flat Package) capable of having input and output multi-terminals. In such a QFP structure, the joint portion is formed in the outer periphery of four sides, but means for releasing stress based on the difference in thermal expansion between the leadframe and the substrate is not formed, so that such a stress is stored in the joint portion. As a result, when conducting, for example, a life test of a final product, breakage is caused in the joint portion and hence breakage is caused in respective wiring portion.

(2) When the base material is joined to the leadframe through soldering, the joint portion is heated, but when the joint portion and the neighborhood thereof are returned to room temperature after the soldering, stress remains in the joint portion to cause undesirable situations such as warp, distortion and the like. In a step of mounting a semiconductor element, therefore, it is difficult or impossible to conduct the carrying and mounting operations of the semiconductor element due to the occurrence of warp and distortion, and consequently many inferior products are obtained. Additionally, in the conventional method, the lead is merely positioned to the substrate and is not fixed thereto. As a result, when the solder is returned from the heated state to room temperature, thermal stress is directly applied to the soldered joint between the lead and the through-hole, so that there is caused a fear of lowering the reliability in the soldered joint.

(3) In the joining between the leadframe and the substrate, it is necessary to conduct the positioning therebetween with a high accuracy in addition to given heating and pressurizing operations. In fact, the proper positioning is difficult to lower the yield in the joining.

It is therefore an object of the present invention to overcome the disadvantages described above, and to provide a new technique for improving the bonding strength of the leadframe to semiconductor substrate in semiconductor packages.

SUMMARY OF THE INVENTION

These and additional objects are accomplished by the various aspects of the present invention wherein, briefly, according to a principal aspect, the substrate layer is separated along a path which connects the center portions of adjacent through holes. After the separated portion of the substrate layer has been removed, the newly created edge of the substrate layer will include a plurality of metallized half vias. The bonding fingers of the leadframe are then formed into a down set (or up set) format and soldered to the substrate at the severed, plated through holes (or metalized half vias). This technique increases the contact area between the leadframe and the substrate. In addition, the down set (or up set) format of the leadframe bonding fingers decreases the stress built up due to CTE mismatch between the substrate and the leadframe.

A first aspect of the present invention is directed to an integrated circuit chip package comprising a layer of semiconductor substrate and a leadframe having a plurality of bonding fingers. At least one edge portion of the substrate layer has been castellated to form a plurality of metalized half vias (or indentations) along that edge portion of the substrate layer. Each of the leadframe bonding fingers is physically and electrically connected to a respective metalized half via along the substrate edge. Before the bonding fingers are attached to the substrate layer at their respective metalized half vias, however, the distal end portions of the bonding fingers are formed into either an up set or down set format. In this way, the contact area between the leadframe bonding fingers and the substrate is increased, and the stress build-up due to CTE mismatch between the substrate and the leadframe is decreased.

A second aspect of the present invention is directed to a method for making an improved integrated circuit chip package. The package includes a leadframe having a plurality of bonding fingers. The method includes the steps of providing a layer of semiconductor substrate having a plurality of plated through holes therein; separating a portion of said substrate layer along a path which connects the center portions of adjacent through holes, thereby forming a plurality of severed through holes (or metalized half vias); removing the separated portion of substrate layer to forming a new, second edge of the substrate layer, wherein said second edge includes the plurality of metalized half vias; forming the distal end portion of each of the leadframe bonding fingers either an up set format or down set format; and electrically and physically connecting each of the bonding fingers to a respective metalized half via using soldering technique.

Additional objects, features and advantages of the various aspects of the present invention will become apparent from the following description of the preferred embodiment, which description should be taken in conjunction with the accompanying drawings.

BRIEF DESCRIPTION OF THE DRAWINGS

FIGS. 1A and 1B illustrate conventional techniques for bonding leadframe bonding fingers to the semiconductor substrate.

FIG. 2A shows a cross-sectional view of the improved semiconductor integrated circuit chip package in accordance with the technique of the present invention.

FIG. 2B illustrates a perspective view of area 300 of FIG. 2A.

FIG. 2C illustrates a top view of the area 400 of FIG. 2A.

FIG. 3A illustrates one embodiment of the area 400 of FIG. 2A.

FIG. 3B illustrates an alternate embodiment of the area 400 of FIG. 2A.

DETAILED DESCRIPTION OF THE PREFERRED EMBODIMENT

FIGS. 1A and 1B illustrate two different types of conventional ETE (electrically and thermally enhanced) semiconductor packages. In FIG. 1A, each of the leadframe's bonding fingers 101 is electrically connected to a respective metallic trace 102 (located on the semiconductor substrate 106) using a plated through hole 103 and solder 108. The plated through hole (or metalized via) is plated with an electrically conductive material which makes contact with a respective copper trace 102. A leadframe bonding finger 101 is then soldered to the plated through hole 103, thereby forming an electrical connection to the conductive trace 102. Solder mask 104 is an electrically non-conductive material, and is provided to prevent solder from spreading over the substrate surface, which can lead to short circuiting of the conductive traces. Each of the plurality of conductive traces 102 is connected to a respective bonding wire 109, which, in turn, is electrically connected to a respective bond pad on the semiconductor die 105.

In FIG. 1B, electrical connection is made from the leadframe finger 101 to the conductive trace 102 by physically bonding the leadframe finger to the conductive trace (at area 152) using a thermal compression bonding technique such as, for example, gang bonding.

One of the primary objectives of the technique of the present invention is to increase the bonding strength of the leadframe to substrate connections in MQFP and ETE packages. Some conventional techniques take advantage of a gang bonding process (as shown, for example, in FIG. 1B), wherein the leadframe 101 is thermally bonded to the copper trace 102 using a thermal compression process. This technique suffers disadvantages in that the contact area between the leadframe and copper trace at 152 is relatively small, which means that the bonding area is relatively weak. Typically, breakage occurs between the leadframe and copper trace in this area, for example during temperature cycling, due to the materials having different coefficients of thermal expansion (CTE).

Other conventional techniques adhere the leadframe bonding fingers to the substrate by bonding the fingers to the substrate at plated through holes using a solder reflow process. This is shown, for example, in FIG. 1A. As with the package of FIG. 1B, the package of FIG. 1A provides a relatively small contact area between the leadframe bonding finger and the solder 108, which is used to bond the bonding finger to the substrate.

Using the technique of the present invention, the bonding strength of the leadframe to substrate connections in MQFP and ETE packages is increased compared to conventional techniques such as those described above.

FIG. 2A illustrates a cross-sectional view of one embodiment of the present invention. The technique for achieving the embodiment shown in FIG. 2A begins with providing an internal package interconnect (IPI) substrate having a plurality of etched, electrically conductive traces and a plurality of plated through holes. Such a substrate layer is shown in FIG. 1A by PC board substrate 106. Next, a portion of the substrate layer is separated along a path which connects the center portions of adjacent through holes. This portion is identified in FIG. 1A by reference numeral 175. The separating of portion 175 from the remainder of the substrate layer may be accomplished using any one of a variety of techniques such as, for example, cutting, punching, sawing and/or routing. Lasers may also be used to separate portion 175 from the remainder of the substrate layer.

After the separated portion of the substrate layer 175 has been removed, the newly created edge of the substrate layer will include a plurality of severed (or semi) through holes (or metalized half vias), as shown, for example, in FIG. 2B.

FIG. 2B shows a perspective view of the area 300 outlined in FIG. 2A. As can be seen in FIG. 2B, each of the plurality of through holes 310 has been severed into about half during the process step where the outer edge portion of the substrate layer 175 (FIG. 1A) has been separated and removed from the remaining portion of the substrate layer. After portion 175 has been separated, the remaining edge of the substrate layer as shown in FIG. 2B will include a plurality of severed, plated through holes (or metalized half vias), which form a plurality of indentations along the edge portion of the PCB substrate layer 306.

After the substrate layer has been formed with the plurality of metalized half vias (or indentations), the leadframe of the package is attached to the substrate layer a the manner as shown in FIGS. 2 and 3. More specifically, as shown in FIG. 2B, the distal end portion 301a of each of the leadframe bonding fingers 301 is formed or shaped into a down set format. The down set format generally can be described as a step-shaped design comprising a relatively vertical portion which is interposed between two relatively, non-coplanar horizontal portions.

Once the leadframe bonding fingers have been formed into a down set format, each finger is aligned to a respective metalized half via, as shown in FIG. 2B. Each finger is then electrically and physically connected to the respective via using a soldering technique such as, for example, a fountain solder process or a solder pasting process.

FIG. 2C illustrates a top view of the area 400 of FIG. 2A. As shown, the solder 308 occupies the entire volume of the metalized half via, and physically and electrically bonds the leadframe bonding finger 301 to the substrate 306.

By using the technique of the present invention as described above, the contact area between the leadframe bonding fingers and the substrate is significantly increased. The increase in contact area allows for an increase in the adhesion of the leadframe bonding fingers to the substrate which, in turn, increases the bonding strength of the leadframe-to-substrate connection. This increase in bonding strength helps to reduce the stress build-up at the leadframe-to-substrate bonding area, a significant part of which is caused by the factors described in the Background of the Invention section of this application.

FIG. 3A illustrates a close-up of the area 400 of FIG. 2A. This close-up helps to clarify how the technique of the present invention increases the bonding strength between the leadframe finger 301 and the substrate. As can be seen in FIG. 3A, the down set format of the distal end portion of the leadframe bonding finger 301a allows for the bonding finger to be soldered to the substrate/metallic trace along two different surfaces which are at substantially right angles to each other. The first bonding surface is located along the top surface of the tip of the leadframe bonding finger, identified in FIG. 3A as surface 301a(ii). The orientation of the solder bond at surface 301a(ii) may be characterized as being along a substantially and relatively horizontal plane. The second bonding surface occurs at the substantially vertical portion of the leadframe bonding finger, identified in FIG. 3A as surface 301a(iii). The orientation of the solder bond along surface 301a(iii) may be characterized as being along a substantially and relatively vertical plane. Together, the soldering of the leadframe bonding finger along both a relatively horizontal plane and relatively vertical plane provides for improved bonding characteristics as compared to conventional bonding techniques such as that shown in FIG. 1A.

As can be seen in FIG. 1A, the orientation of the solder bond connecting leadframe bonding finger 101 to the substrate 106 is along only a singular bonding plane (e.g. horizontal). Because the vertical and horizontal stresses of the solder bonding areas due to CTE mismatch may differ significantly, the "L-shaped" bond of the present invention provides for a stronger and more reliable bond than that of conventional techniques.

One factor which contributes to the strength of the leadframe-to-substrate bond of the present invention is that each leadframe bonding finger is bonded to the substrate along two surfaces which are substantially tangential to each other, thereby providing strength along both a horizontal axis and a vertical axis. Additionally, the increase in bonding strength of the leadframe-to-substrate bond of the present invention is also attributable to the increased contact area between each leadframe bonding finger and the substrate. As noted in FIG. 1A, only a small portion of the solder 108 physically bonds the leadframe bonding finger 104 to the plated through hole 103, while the majority portion of the solder within the through hole remains relatively unused.

In contrast, as shown in FIG. 3A, a majority portion of the solder 108 is utilized to physically bond the leadframe bonding finger 301a to the substrate 306 and metallic trace 302. The presence of the foot portion of the bonding finger at 301b also provides for additional bonding strength by restricting the movement of the bonding finger in the vertical direction (relative to the drawing of FIG. 3A).

In addition to increasing the bonding strength of the leadframe-to-substrate bonds, the technique of the present invention also facilitates the alignment of the bonding fingers to their respective contact points on the substrate layer. For example, as shown in FIG. 2B, each of the bonding fingers may be aligned to a respective indentation along the edge portion of the substrate layer. These indentations (or severed through holes) provide means for facilitating the alignment of the bonding fingers by physically restricting the movement of each bonding finger once that bonding finger has penetrated into the region formed by a particular indentation.

FIG. 3B shows an alternate embodiment of the area 400 of FIG. 2A. In the embodiment of FIG. 3B, the conductive trace 302 wraps around the substrate layer 306 and extends along the bottom portion of the substrate layer, as shown at 310b. One advantage of this embodiment is that the surface area which provides for the electrical connection between the leadframe bonding finger 310a and the conductive trace 302 is increased, thereby improving the electrical connection at the leadframe-to-substrate bonding areas.

It is to be noted that, when attaching the leadframe bonding finger to the substrate, it is the top surface of the bonding finger (represented in FIG. 3A), for example, for a surface 301a(ii) which is used to bond the down set format bonding finger to the substrate. Moreover, this top surface of the bonding finger is soldered to the bottom surface of the semiconductor substrate. Such a leadframe-to-substrate interconnect bonding technique is considered to be both novel and unobvious in view of conventional bonding techniques taught by the prior art.

Additionally, it is to be noted that the shape of the leadframe bonding fingers may differ in accordance with the design constraints of the semiconductor interconnect package. For example, rather than forming the bonding fingers into a down set format, all or a selected number of the fingers may be formed into an up set format (not shown), whereby the bottom surface of each leadframe bonding finger is bonded to the top surface of the semiconductor substrate. In addition, the angles which form the down set or up set format of the leadframe bonding finger may be other than right angles.

Furthermore, while one aspect of the present invention describes severing the plated through holes on the PC board substrate into about half, it is to be understood that a greater or lesser percentage of the through hole may be separated away from the remaining portion of the substrate layer, depending upon the needs as determined by one skilled in the art. In this regard, the term "metalized half via" (as used herein) may include alternate embodiments where the plated through hole has been severed into greater than or less than about half. Moreover, the formation of the plurality of severed through holes along the edge(s) of the substrate layer may be accomplished by techniques other than those described above. For example, the substrate layer may first be formed to include a plurality of indentations along its edge(s), and then the indentations may be plated to form the plurality of semi-through holes.

Although several preferred embodiments of this invention have been described in detail herein with reference to the accompanying drawings, it is to be understood that the invention is not limited to these precise embodiments, and that various changes and modifications may be affected therein by one skilled in the art without departing from the scope or spirit of the invention as defined in the appended claims.

What is claimed is:

1. An integrated circuit chip package comprising:

a layer of semiconductor substrate, said layer of substrate having a top surface, and a bottom surface, and a plurality of metal conductors along at least one edge surface of said substrate layer, each of said metal conductors extending along said edge surface from said top surface to said bottom surface of said substrate layer;

said at least one edge being castellated corresponding to the plurality of metal conductors to form a plurality of metalized half vias along said edge, each of said metalized half vias defining a partial aperture in said substrate along a respective longitudinal axis; and a leadframe, said leadframe including a plurality of leadframe bonding fingers, wherein each of said fingers is physically and electrically connected to the metal conductor of a respective metalized half via along at least said edge surface of said substrate layer wherein the leadframe bonding fingers are Z-shaped at the finger's ends, said leadframe bonding fingers being physically connected to the edge surface and an additional surface of said substrate layer.

2. The package of claim 1 further including a pattern of electrically conductive material bonded to said substrate layer, said pattern of material forming a plurality of electrically conductive traces, wherein each of said plurality of conductive traces is electrically connected to a respective metal conductor of said plurality of metal conductors.

3. The package of claim 1 wherein a plurality of solder bonds physically and electrically bond each of said bonding fingers to each respective half via.

4. The package of claim 1 wherein a cross-sectional area of said metalized half via taken transverse to said longitudinal axis is substantially semi-circular in shape.

5. The integrated circuit chip package of claim 1 wherein the leadframe bonding fingers are physically connected to the edge surface and the top surface of said substrate layer.

6. The integrated circuit chip package of claim 1, wherein the leadframe bonding fingers are physically connected to the edge surface and the bottom surface of said substrate layer.

7. An integrated circuit chip package comprising:

a layer of semiconductor substrate having a top surface, a bottom surface, and at least one edge surface;

said substrate layer including a plurality of indentations along said at least one edge surface, each of said indentations defining a respective longitudinal axis;

wherein a portion of said edge surface corresponding to each of said indentations includes a plating of an electrically conductive material which extends along said edge surface from said top surface to said bottom surface of said substrate layer; and a leadframe, said leadframe including a plurality of leadframe bonding fingers, wherein each of said fingers is physically and electrically connected to said conductive plating along at least said edge surface of said substrate layer, wherein the leadframe bonding fingers are Z-shaped at the finger's ends, said leadframe bonding fingers being physically connected to the edge surface and an additional surface of said substrate layer.

8. The package of claim 7 further comprising a pattern of electrically conductive material bonded to said substrate layer, said pattern of material forming a plurality of electrically conductive traces, wherein each of said plurality of conductive traces is electrically connected to a respective conductive plating.

9. The integrated circuit chip package of claim 7, wherein the leadframe bonding fingers are physically connected to the edge surface and a top surface of said substrate layer.

10. The integrated circuit chip package of claim 7, wherein the leadframe bonding fingers are physically connected to the edge surface and a bottom surface of said substrate layer.

11. The package of claim 7 wherein a cross-sectional area of said indentation taken transverse to said longitudinal axis is substantially semi-circular in shape.

* * * * *